(12) United States Patent
Khan

(10) Patent No.: US 11,021,789 B2
(45) Date of Patent: Jun. 1, 2021

(54) MOCVD SYSTEM INJECTOR FOR FAST GROWTH OF ALINGABN MATERIAL

(71) Applicant: University of South Carolina, Columbia, SC (US)

(72) Inventor: Asif Khan, Irmo, SC (US)

(73) Assignee: University of South Carolina, Columbia, SC (US)

( * ) Notice: Subject to any disclaimer, the term of this patent is extended or adjusted under 35 U.S.C. 154(b) by 237 days.

(21) Appl. No.: 15/737,604

(22) PCT Filed: Jun. 22, 2016

(86) PCT No.: PCT/US2016/038651
§ 371 (c)(1),
(2) Date: Dec. 18, 2017

(87) PCT Pub. No.: WO2016/209886
PCT Pub. Date: Dec. 29, 2016

(65) Prior Publication Data
US 2018/0155826 A1    Jun. 7, 2018

Related U.S. Application Data

(60) Provisional application No. 62/182,798, filed on Jun. 22, 2015.

(51) Int. Cl.
*C23C 16/30* (2006.01)
*C23C 16/455* (2006.01)
*C23C 16/458* (2006.01)

(52) U.S. Cl.
CPC .......... *C23C 16/303* (2013.01); *C23C 16/458* (2013.01); *C23C 16/45565* (2013.01); *C23C 16/45578* (2013.01)

(58) Field of Classification Search
CPC ................ C23C 16/303; C23C 16/458; C23C 16/45578; C23C 16/45565
USPC .......... 427/248.1–255.7, 162–169, 569–579; 118/715–733
See application file for complete search history.

(56) References Cited

U.S. PATENT DOCUMENTS

| | | | |
|---|---|---|---|
| 4,614,961 A | 9/1986 | Khan et al. | |
| 4,616,248 A | 10/1986 | Khan et al. | |
| 5,070,815 A | 12/1991 | Kasai et al. | |
| 5,614,026 A | * 3/1997 | Williams | ............ C23C 16/4412 118/723 ER |

(Continued)

FOREIGN PATENT DOCUMENTS

| | | |
|---|---|---|
| WO | WO 93/26049 | 12/1993 |
| WO | WO 2008/067537 | 6/2008 |

*Primary Examiner* — Michael P Wieczorek
*Assistant Examiner* — Michael G Miller
(74) *Attorney, Agent, or Firm* — Dority & Manning, P.A.

(57) ABSTRACT

A conical supply tube is provided, along with deposition systems using such a tube and methods of its use. The conical supply tube includes a conical head formed from a hollow structure defining a having a fitting end and an opposite, shower end, with the fitting end has an initial diameter that is less than a diameter at the shower end. A MOCVD chamber is also generally provided that includes such a conical supply tube and a susceptor configured to hold a substrate facing the shower end of the conical supply tube. Methods are provided for growing a group III nitride layer on a surface of a substrate.

14 Claims, 7 Drawing Sheets

(56) References Cited

U.S. PATENT DOCUMENTS

| | | | |
|---|---|---|---|
| 5,751,896 A * | 5/1998 | Sandhu | C23C 16/45565 219/411 |
| 6,228,253 B1 | 5/2001 | Gandman | |
| 6,690,042 B2 | 2/2004 | Khan et al. | |
| 6,764,888 B2 | 7/2004 | Khan et al. | |
| 8,222,999 B2 | 7/2012 | Khan et al. | |
| 8,304,756 B2 | 11/2012 | Khan | |
| 8,338,273 B2 | 12/2012 | Khan et al. | |
| 8,354,663 B2 | 1/2013 | Adivarahan et al. | |
| 8,354,687 B1 | 1/2013 | Adivarahan et al. | |
| 8,372,697 B2 | 2/2013 | Khan et al. | |
| 8,415,654 B2 | 4/2013 | Khan et al. | |
| 8,541,817 B2 | 9/2013 | Fareed et al. | |
| 8,563,995 B2 | 10/2013 | Khan et al. | |
| 8,652,958 B2 | 2/2014 | Khan | |
| 8,686,396 B2 | 4/2014 | Khan | |
| 8,692,293 B2 | 4/2014 | Khan et al. | |
| 8,698,191 B2 | 4/2014 | Khan et al. | |
| 9,142,714 B2 | 9/2015 | Adivarahan et al. | |
| 9,343,563 B2 | 5/2016 | Khan et al. | |
| 9,543,425 B2 | 1/2017 | Khan et al. | |
| 9,882,039 B2 | 1/2018 | Khan et al. | |
| 9,985,177 B2 | 5/2018 | Khan et al. | |
| 2003/0172872 A1* | 9/2003 | Thakur | C23C 16/4412 118/715 |
| 2008/0163816 A1* | 7/2008 | Toda | C23C 16/4481 118/715 |
| 2010/0072489 A1 | 3/2010 | McLaurin et al. | |
| 2011/0220867 A1 | 9/2011 | Khan et al. | |
| 2012/0234238 A1 | 9/2012 | Hsu et al. | |
| 2013/0049140 A1 | 2/2013 | Asenov et al. | |
| 2013/0056770 A1 | 3/2013 | Shatalov et al. | |
| 2015/0030046 A1 | 1/2015 | Aoki et al. | |
| 2015/0260659 A1 | 9/2015 | Chuang et al. | |

\* cited by examiner

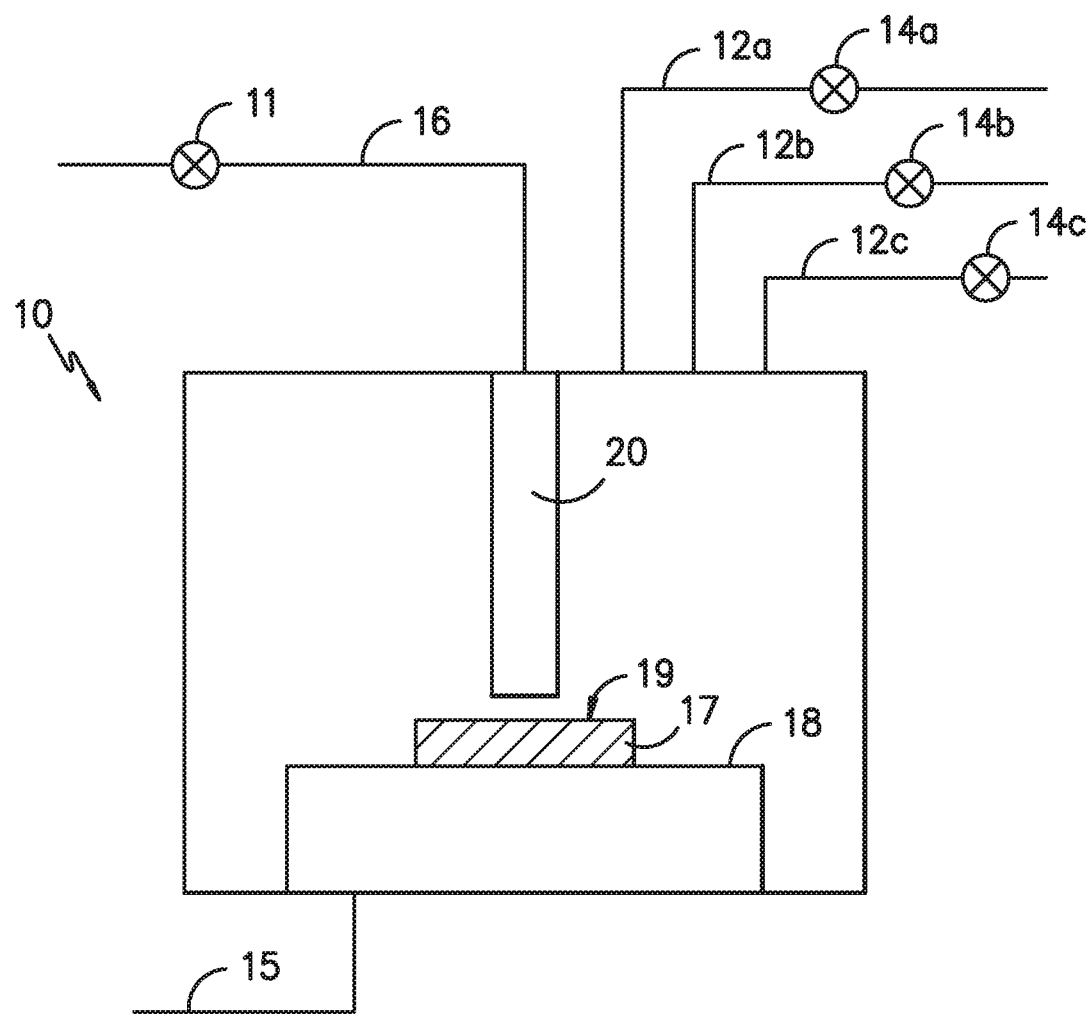
FIG. -1a-

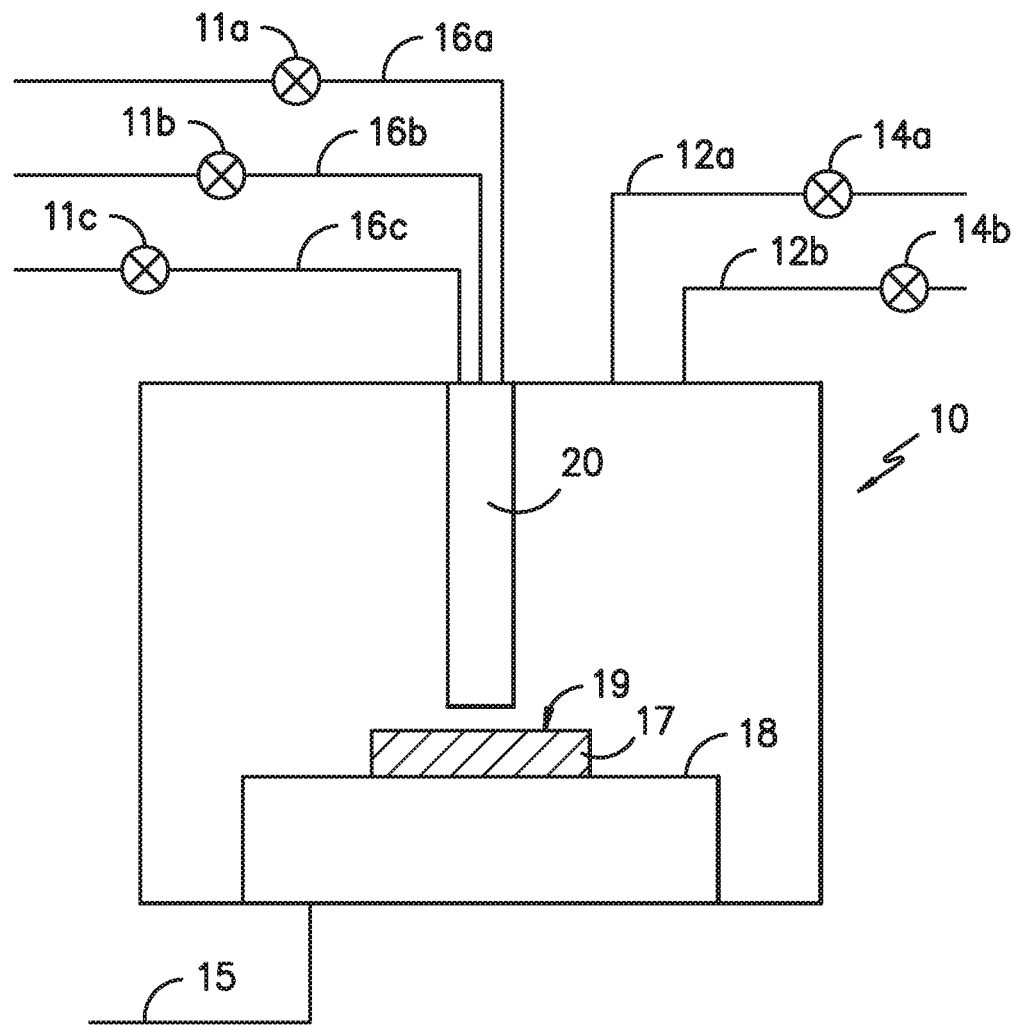
FIG. -1b-

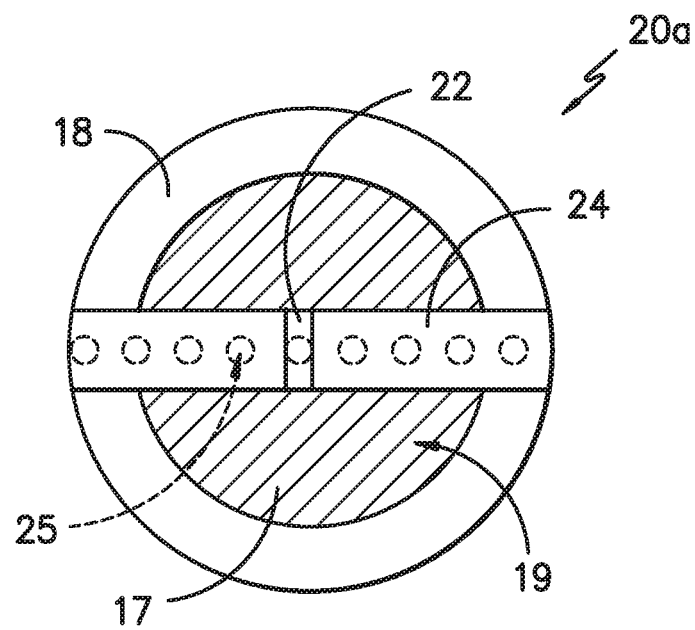
FIG. -2a-
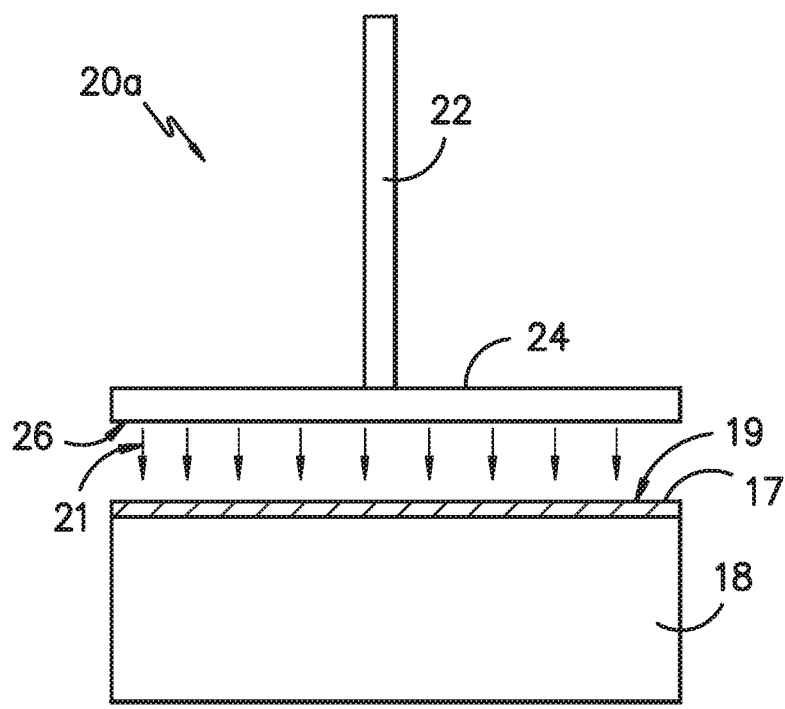
FIG. -2b-

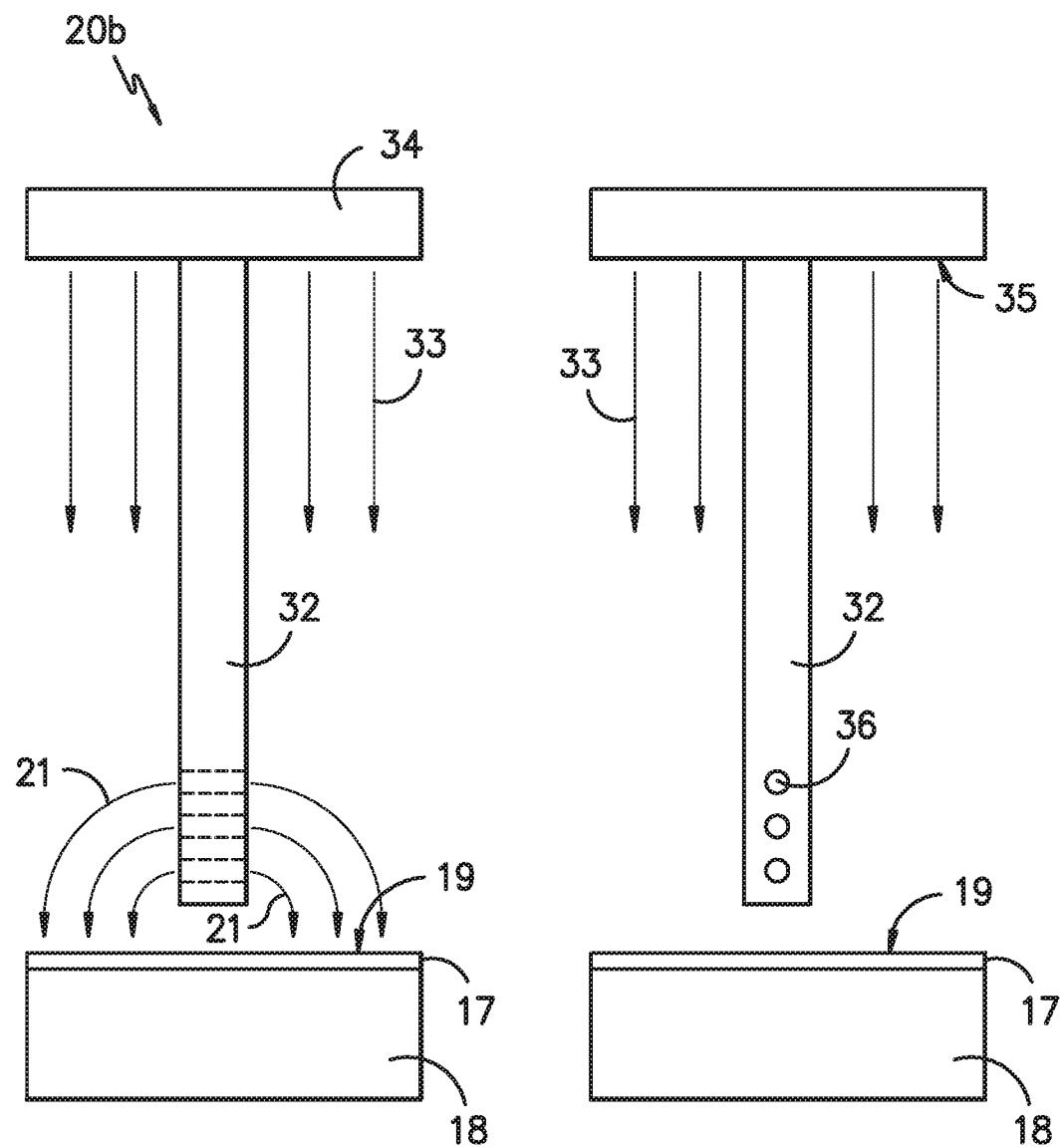
FIG. -3a-    FIG. -3b-

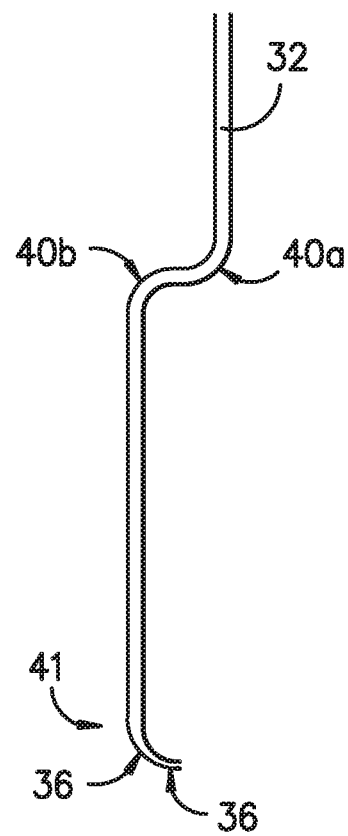
FIG. -4-
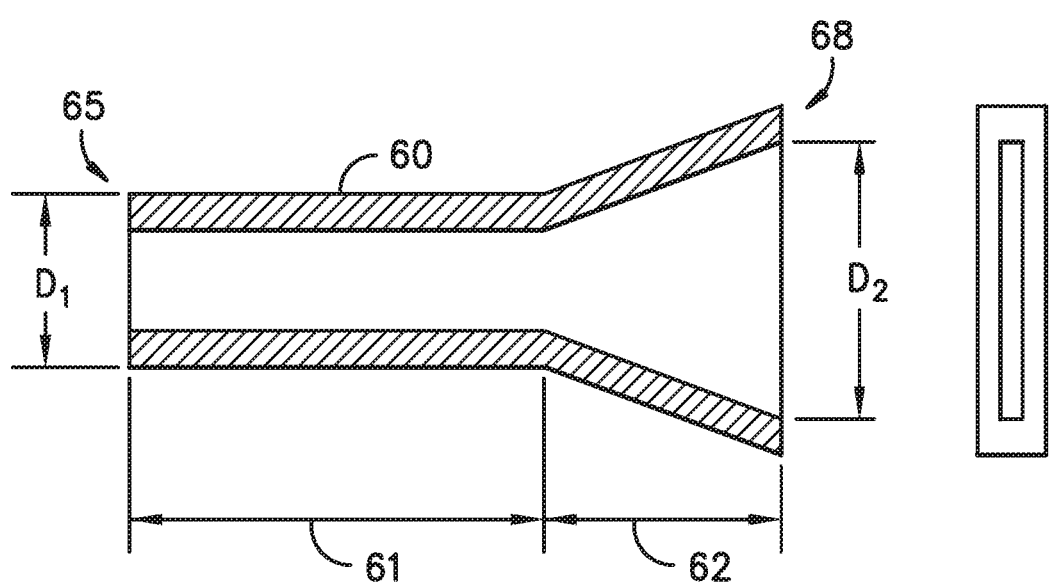
FIG. -5a-

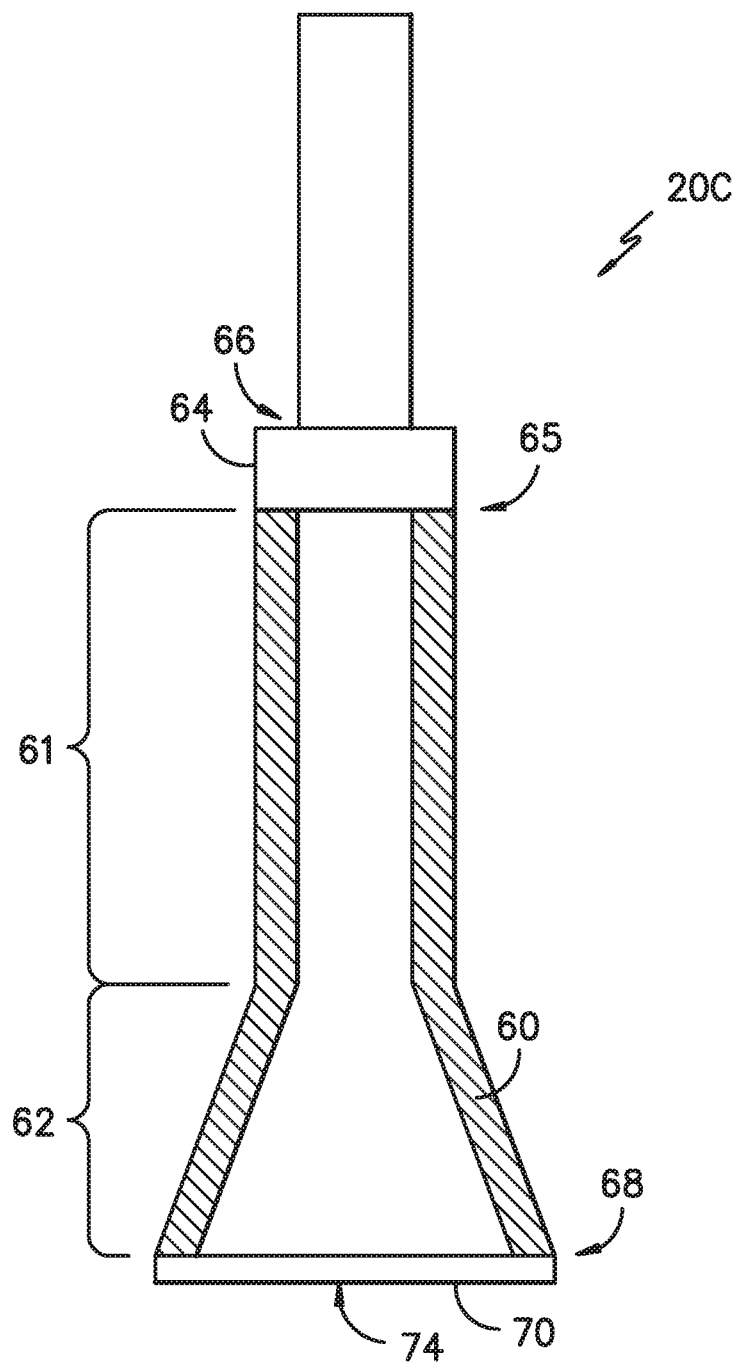
FIG. —5b—

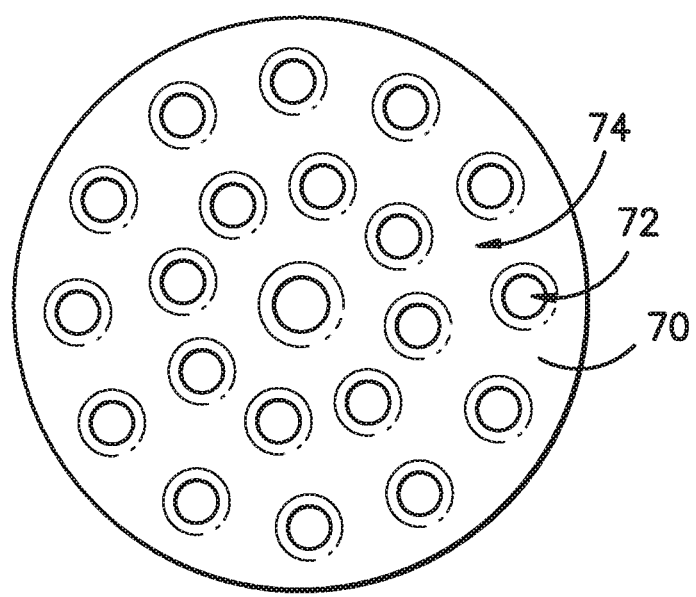
FIG. -6-

United States Patent US 11,021,789 B2

MOCVD SYSTEM INJECTOR FOR FAST GROWTH OF AlINGABN MATERIAL

PRIORITY INFORMATION

The present application is the national stage entry of International Patent Application No. PCT/US2016/038651 having a filing date of Jun. 22, 2016, which claims priority to U.S. Provisional Patent Application Ser. No. 62/182,798 titled "MOCVD System Injector for Fast Growth of AlInGaBN Material" filed on Jun. 22, 2015, both of which are incorporated herein in their entirety by reference thereto.

BACKGROUND

Group III-nitride and its ternary and quaternary compounds are prime candidates for fabrication of visible and ultraviolet high-power and high-performance optoelectronic devices and electronic devices. These devices are typically grown epitaxially as thin films by growth techniques including molecular beam epitaxy (MBE), metalorganic chemical vapor deposition (MOCVD), or hydride vapor phase epitaxy (HVPE).

In conventional MOCVD, the precursors (such tri-methyl gallium, ammonia etc.) are supplied continuously to the reactant chamber. Growing AlInGaBN requires a very high growth temperature (e.g., about 1000° C. to about 1100° C.). Even higher temperatures are required for growth utilizing relatively large percentages of Al and/or B, such as at growth temperatures of about 1300° C. to about 1450° C. At these extremely high temperatures, however, the precursors tend to combine in the chamber and "rain down" onto the surface of the substrate, effectively forming adduct particles thereon. These adduct formations during MOCVD hampers the subsequent epilayer growths by increasing the number of stacking faults and dislocation density.

A pulsed metal organic chemical vapor deposition (P-MOCVD) or pulsed atomic layer epitaxy (PALE), in which the precursors are supplied with alternative supply of sources, alleviates the above mentioned problem. This alternative or pulsing technique not only suppress the adduct formation but also provides a unique opportunity to bend the dislocation propagation, to deposit monolayers of material thereby decreasing the slip (which is often the reason for stacking fault generation). Thus, P-MOCVD makes an attractive technique for substrate and epilayer growth and device fabrication.

Although the P-MOCVD alleviates some of the potential problems plaguing III-N devices (especially over non-polar substrates and materials) and represents an enabling technology for the growth of non-polar III-N devices, the relatively high defect density in the directly-grown non-polar or semi-polar III-N films reduces the efficiency of subsequently grown devices compared to what could be achieved by homoepitaxial growth on a perfect substrate. In particular, these P-MOCVD systems are more complicated to design and run growth.

Thus, a need exists for a simplified and efficient method and system for high temperature MOCVD growth of AlInGaBN material while suppressing or eliminating adduct formation.

SUMMARY

Objects and advantages of the invention will be set forth in part in the following description, or may be obvious from the description, or may be learned through practice of the invention.

A conical supply tube is generally provided, along with deposition systems using such a tube and methods of its use. In one embodiment, the conical supply tube includes a conical head formed from a hollow structure defining a having a fitting end and an opposite, shower end, with the fitting end has an initial diameter that is less than a diameter at the shower end. A MOCVD chamber is also generally provided that includes such a conical supply tube and a susceptor configured to hold a substrate facing the shower end of the conical supply tube.

Methods are also provided for growing a group III nitride layer on a surface of a substrate. In one embodiment, the method includes introducing a source gas into the MOCVD chamber though the supply tube of any preceding claim. The supply tube defines a terminal end at a distance of about 1 to about 10 inches from the surface of the substrate, and the MOCVD chamber has a temperature of about 1000° C. to about 1450° C. The source gas comprises at least one of a metal-organic source gas, a boron source gas, or a nitrogen source gas.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which:

FIG. 1 shows a schematic diagram of an exemplary MOCVD growth chamber for use in certain embodiments of the present invention;

FIG. 2a shows a top view of a straight supply pipe and supply nozzle according to one embodiment;

FIG. 2b shows a cross-sectional view of the straight supply pipe and supply nozzle of FIG. 1a;

FIG. 3a shows a front view of a bent supply pipe according to another embodiment;

FIG. 3b shows a side view of the bent supply pipe of FIG. 2a;

FIG. 4 shows an exemplary bent tube according to one particular embodiment for use in the bent supply pipe of FIGS. 3a and 3b;

FIG. 5a shows a cross-sectional view of a conical supply tube connected to a shower-like nozzle, according to yet another embodiment;

FIG. 5b shows a cross-sectional view of the conical supply tube of FIG. 5a connected to a shower-like nozzle; and FIG. 6 shows a bottom view of an exemplary shower-like nozzle for use with the conical supply tube of FIG. 5b.

Repeat use of reference characters in the present specification and drawings is intended to represent the same or analogous features or elements of the present invention.

Definitions

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

As used herein, the term "substantially free" means no more than an insignificant trace amount present and encompasses completely free (e.g., 0 molar % up to 0.01 molar %).

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Methods are generally provided that increase the growth rate, while maintaining the single crystal material quality for AlInGaBN material, along with apparatus and systems for performing the same. Simply reducing the distance between the injector and the susceptor in a normal MOCVD system creates a significant issue for growth, because of rf-coupling to the metallic top plate. In one embodiment, a modified nozzle injector is generally provided for a MOCVD system. The nozzle injector is configured to introduce the metallic precursor gas(es), such as metal organic gas(es), very close to the susceptor, and thus the growth surface.

Methods are also generally provided for growing extremely low defect density non-polar and semi-polar III-nitride layers over a base layer, and the resulting structures. In particular, an AlInGaBN can be achieved on a non-polar or semi-polar base layer, with little or no defect density, while maintaining uniformity across the AlInGaBN layer and a relatively fast growth rate.

I. Base Layer

According to the present invention, the group III nitride epilayer to be selectively doped can be formed on any suitable non-polar or semi-polar base layer. Suitable base layers can include materials such as but are not limited to, sapphire, silicon carbide, lithium aluminate, spinel, gallium nitride, aluminum nitride, aluminum gallium nitride, indium gallium nitride, aluminum indium gallium nitride, and the like. In one particular embodiment, the base layer is in the form of a substrate. Any suitable non-polar or semi-polar substrate can be used as the base layer to grow the group III nitride epilayer. Although the following description discusses a "substrate", other types of base layers can be used in accordance with the present invention.

Non-polar substrates generally encompass those grown in a-plane, r-plane, or m-plane. For example, the non-polar substrate can be an m-face or r-plane sapphire substrate such that there is no polarization charge supplied in the device layers of this structure.

Non-polar and semi-polar III-Nitride substrates are of great interest to the nitride semiconductor device community because they enable the deposition of improved device active regions that can be used to realize new and improved high performance optoelectronic and electronic nitride semiconductor devices. Some theoretical predictions believe that non-polar and semi-polar GaN will enable higher quantum efficiencies and improved electrical characteristics for light emitting diodes (LEDs) and laser diodes and will enable the development of very high performance enhancement mode (e-mode) high electron mobility transistors (HEMTs). While such predictions have been partially corroborated by experiment, previous attempts to fabricate devices on non-polar GaN were severely hampered by the presence of very high defect densities in the active regions which had origins in the substrates and which derived from the heteroepitaxial approaches used in the non-native approach to their fabrication.

II. Epilayer Growth

No matter the starting base layer for forming the substrate, a group III nitride epilayer is grown over the base layer. "Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds (e.g., AlGaN and AlInGaN) are particularly preferred. As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN).

In one particular embodiment, the methods can be utilized to grow a layer of AlInGaBN. In this embodiment, the group III nitride epilayer can be composed of any combination of group III elements (e.g., Al, In, and Ga), boron, and nitride. In one particular embodiment, the group III-nitride epilayer can be represented by the formula $Al_xIn_yGa_{1-x-y}BN$, wherein $0 \leq x \leq 1$, $0 \leq y \leq 1$ and $0 < x+y \leq 1$. In employing growth techniques to grow the group III nitride epilayer, the precursor source gases typically include at least one metal-organic source (e.g., trimethyl aluminum, trimethyl gallium, triethyl gallium, trimethyl indium, triethylalluminum, AlCl, $AlCl_3$ or combinations thereof), a boron source (e.g., trimethy boron, triethyl boron), a nitrogen source (e.g., ammonia), a carrier gas (e.g., argon, hydrogen, nitrogen, etc.), and an optionally doping source (e.g., silane, biscyclopentadienyl magnesium, etc.). Of course, other materials can be utilized to grow the group III nitride epilayer, and the present invention is not intended to be limited by the above listed materials. For example, another type of metal-organic source, boron source, and/or nitrogen source can be utilized to grow the group III nitride epilayer.

During MOCVD growth of the group III nitride epilayer, the source gases are supplied in a vapor phase to the growth chamber. Referring to FIGS. 1a and 1b, schematic of exemplary MOCVD growth chambers 10 are generally shown. The MOCVD growth chamber 10 includes a susceptor 18 configured to hold or support a wafer 17, as is known in the art. Vacuum line 15 is configured to control the pressure within the MOCVD growth chamber 10, also as known in the art.

In FIG. 1a, multiple supply lines 12a, 12b, 12c are shown connected to the MOCVD growth chamber 10 in order to introduce supply gases therein, with flow controllable via respective supply valves 14a, 14b, 14c, from a respective supply tank (not shown). Each supply line 12a, 12b, 12c is configured to introduce a supply gas generally into the MOCVD growth chamber 10, and can be used as purge gases, growth gases, etc. Although shown with three general supply lines 12a, 12b, 12c, any suitable number of supply lines can be utilized within the scope of this invention. Supply line 16 is shown introducing a supply gas into the internal supply tube 20. The internal supply tube 20 is configured to introduce the supply gas into the MOCVD growth chamber 10 at a close proximity to the surface 19 of the wafer 17 on the susceptor 18.

In FIG. 1b, multiple supply lines 16a, 16b, 16c are shown connected to the internal supply tube 20 and are configured to, collectively, introduce multiple supply gases therein. Thus, a mixture of supply gases can be introduce into the MOCVD growth chamber 10 at a close proximity to the surface 19 of the wafer 17 on the susceptor 18.

The internal supply tube 20 can have several configurations, each of which are discussed in greater detail below.

A. Straight Supply Tube

In one embodiment, a straight supply tube 20a is generally provided, as shown in FIGS. 2a and 2b, for introducing a supply gas (e.g., FIG. 1a) or multiple supply gases (e.g., FIG. 1b) into the MOCVD growth chamber 10 at a close proximity to the surface 19 of the wafer 17 on the susceptor 18. The straight supply tube 20a includes a single supply tube 22 that is substantially straight, and pointing towards the center of the substrate 17. A supply head 24 is attached to the end of the single supply tube 22, and defines a substantially flat, straight bar over the surface 19 of the substrate 17. A plurality of apertures 25 are defined in the bottom surface 26 of the supply head 24, and are configured to supply at least one supply gas 21 to the surface 19 of the substrate 17.

In some embodiments, however, use of straight supply tube 20a had an issue with excessive velocity of the reactants, and led to hazy centers formed on the surface 19. This may be due to a growth rate well above 10 um/hour which may not be sustainable at a temperature range of about 1300° C. to about 1400° C. thereby degrading the crystalline quality.

B. Bent Supply Tube

In another embodiment, a bent supply tube 20b is generally provided, as shown in FIGS. 3a and 3b, for introducing a supply gas (e.g., FIG. 1a) or multiple supply gases (e.g., FIG. 1b) into the MOCVD growth chamber 10 at a close proximity to the surface 19 of the wafer 17 on the susceptor 18. The bent supply tube 20b is similar to the straight supply tube 20a, described above, but has been modified to a bent tube 32 that is pointing towards the edges of the substrate 17.

The tube 32 is positioned below a plate 34 defining apertures 35 allowing carrier gas 33 (e.g., ammonia) to flow therethrough and towards the surface 17 of the substrate 19. The supply gas(es) 21 are carried from the supply line(s) 16 through the tube 32 and out of apertures 36 defined by the tube 32 in close proximity to the surface 17 of the substrate 16. The flow of the carrier gas 33 helps to direct the exiting supply gas 21 from the apertures 36 onto the surface 17 of the substrate 16.

FIG. 4 shows an exemplary cross-section of the bent tube 32 having a first bend 40a and a second bend 40b. Collectively, the first bend 40a and second bend 40b help to slow the flow of the supply gas(es) therethrough, which would otherwise be unimpeded in a straight tube. The final bend 41 curves the end portion of the bent tube 32 such that apertures 36 may be directed toward the surface 17 of the substrate 16.

C. Conical Supply Tube

In a preferred embodiment, a conical supply tube 20c is generally shown in FIGS. 5a and 5b. The conical supply tube 20c includes a conical head 60 that has an expanding area 62 in at least some portion of its length where the average diameter of the conical head 60 is increasing. Thus, the initial diameter ($D_1$) at the fitting end 65 of the conical head 60 is less than the diameter ($D_2$) at the shower end 68.

As show, the expanding area 62 is integral to a tube area 61 to form the conical head 60. In one particular embodiment, the conical head 60 is a hollow structure attached to a shower plate 70 that defines a plurality of apertures 72 such that the supply gas flows through the shower plate 70, as shown in FIG. 6. In use, the bottom surface 74 of the shower plate 70 can be approximately between 1 to 10 inches from the surface 17 of the substrate 19. It can be positioned anywhere from about ½ inch to all the way where the top steel plate of the chamber is.

The conical head 60 is, in one embodiment, constructed from quartz so as to avoid affecting the rf-coupling or creating other electrical issues during growth. As such, the conical head 60 brings the growth species (i.e., the supply gases) closer to the growing surface 17 and hence adduct formation is severely reduced and the metalorganic incorporation efficiency is significantly higher. It can also be constructed out of ceramics such as BN, AlN or sapphire.

When combined with a higher growth temperatures required for AlInGaBN growth (e.g., about 1000° C. to about 1450° C., such as about 1100° C. to about 1350° C.), growth rates as high as about 0.5 µm per hour to about 10 µm per hour are easily achievable for the AlInGaBN layer growth while maintaining good uniformity.

When constructed from quartz, a steal sealing 64 can be utilized wherein the quartz tube 60 exits the fitting 66 (e.g., a Swagelock fitting) on growth chamber wall to avoid gas leakage around an O-ring or other linkage at the quartz-to-steel connection. Thus, Variable Compression Ratio (VCR) fittings between the quartz tube and the steel tube can completely avoiding any leaks.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A conical supply tube, comprising:
a conical head disposed between a variable compression ratio fitting and a shower plate, wherein the conical head is formed from a hollow structure having a fitting end and an opposite, shower end, wherein the fitting end defines a tube area having a constant initial diameter that is less than a diameter of the shower end adjacent a shower plate, wherein the shower end defines an expanding area having an increasing diameter that constantly increases along its length from the initial diameter to the diameter at the shower end adjacent the shower plate.

2. The conical supply tube as in claim 1, wherein the conical head comprises quartz.

3. The conical supply tube as in claim 1, wherein the hollow structure is constructed completely from quartz.

4. The conical supply tube as in claim 1, wherein the shower plate is attached to the shower end of the conical head.

5. The conical supply tube as in claim 4, wherein the shower plate defines a plurality of apertures therein.

6. The conical supply tube as in claim 5, wherein the apertures are substantially equally spaced across the shower plate.

7. The conical supply tube as in claim 4, wherein the shower plate comprises quartz.

8. The conical supply tube as in claim 7, wherein the shower plate is constructed completely from quartz.

9. The conical supply tube as in claim 1, wherein a steel sealing is attached to the fitting end of the conical head to form an air-tight seal.

10. A MOCVD chamber, comprising:
- the conical supply tube of claim 1; and;
- a susceptor configured to hold a substrate facing the shower end of the conical supply tube.

11. A method for growing a group III nitride layer on a surface of a substrate, the method comprising:
- introducing a source gas into an MOCVD chamber through the supply tube of claim 1, wherein the supply tube defines a terminal end at a distance of about 1 to about 10 inches from the surface of the substrate, wherein the MOCVD chamber has a temperature of about 1000° C. to about 1450° C., and wherein the source gas comprises at least one of a metal-organic source gas, a boron source gas, or a nitrogen source gas.

12. The method as in claim 11, wherein the MOCVD chamber has a temperature of about 1100° C. to about 1350° C.

13. The method as in claim 11, wherein the group III nitride layer comprises a AlInGaBN layer.

14. The method as in claim 11, wherein the group III nitride layer comprises $Al_xIn_yGa_{1-x-y}BN$, wherein $0 \leq x \leq 1$, $0 \leq y \leq 1$ and $0 < x+y \leq 1$.

\* \* \* \* \*